United States Patent
Sunohara et al.

(10) Patent No.: US 8,664,536 B2
(45) Date of Patent: Mar. 4, 2014

(54) WIRING SUBSTRATE AND MANUFACTURING METHOD THEREOF

(75) Inventors: Masahiro Sunohara, Grenoble (FR); Shigeaki Suganuma, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 143 days.

(21) Appl. No.: 13/153,590

(22) Filed: Jun. 6, 2011

(65) Prior Publication Data
US 2011/0297426 A1 Dec. 8, 2011

(30) Foreign Application Priority Data

Jun. 7, 2010 (JP) .................................. 2010-130422

(51) Int. Cl.
*H05K 1/09* (2006.01)
(52) U.S. Cl.
USPC ....................................................... 174/255
(58) Field of Classification Search
USPC .................................. 174/251, 255
See application file for complete search history.

(56) References Cited

U.S. PATENT DOCUMENTS 8,049,328 B2 * 11/2011 Marimuthu et al. .......... 257/706
8,248,803 B2 * 8/2012 Lin et al. ...................... 361/709

FOREIGN PATENT DOCUMENTS

| JP | 2006-261167 | | 9/2006 |
| JP | 2007-214437 | | 8/2007 |
| JP | 2008-135482 | * | 6/2008 |
| JP | 2009-238957 | * | 10/2009 |
| JP | 2009-277895 | A1 | 11/2009 |
| WO | WO 2010/021278 A1 | | 2/2010 |

OTHER PUBLICATIONS

Office Action issued on Dec. 17, 2013 in counterpart Japanese Patent Application No. 2010-130422 with English translation.

* cited by examiner

*Primary Examiner* — Chau Nguyen
(74) *Attorney, Agent, or Firm* — Kratz, Quintos & Hanson, LLP

(57) ABSTRACT

A wiring substrate includes a wiring layer made of copper, an electrode layer made of copper, and an insulating layer arranged adjacent to the electrode layer. The wiring layer is stacked on the electrode layer and the insulating layer. The insulating layer and the wiring layer are stacked with an adhesive layer interposed between the insulating layer and the wiring layer. The electrode layer and the wiring layer are stacked with a copper alloy layer formed adjacent to the adhesive layer and interposed between the electrode layer and the wiring layer.

4 Claims, 14 Drawing Sheets

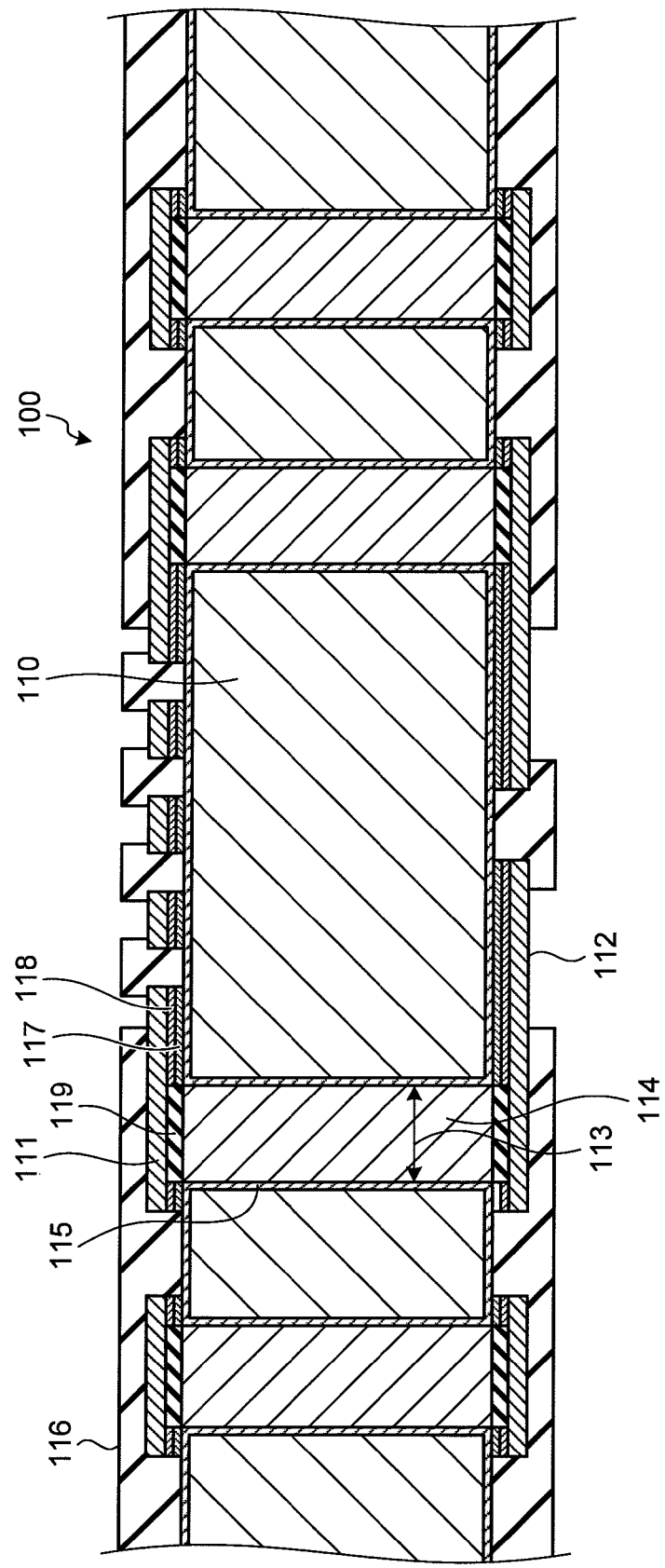

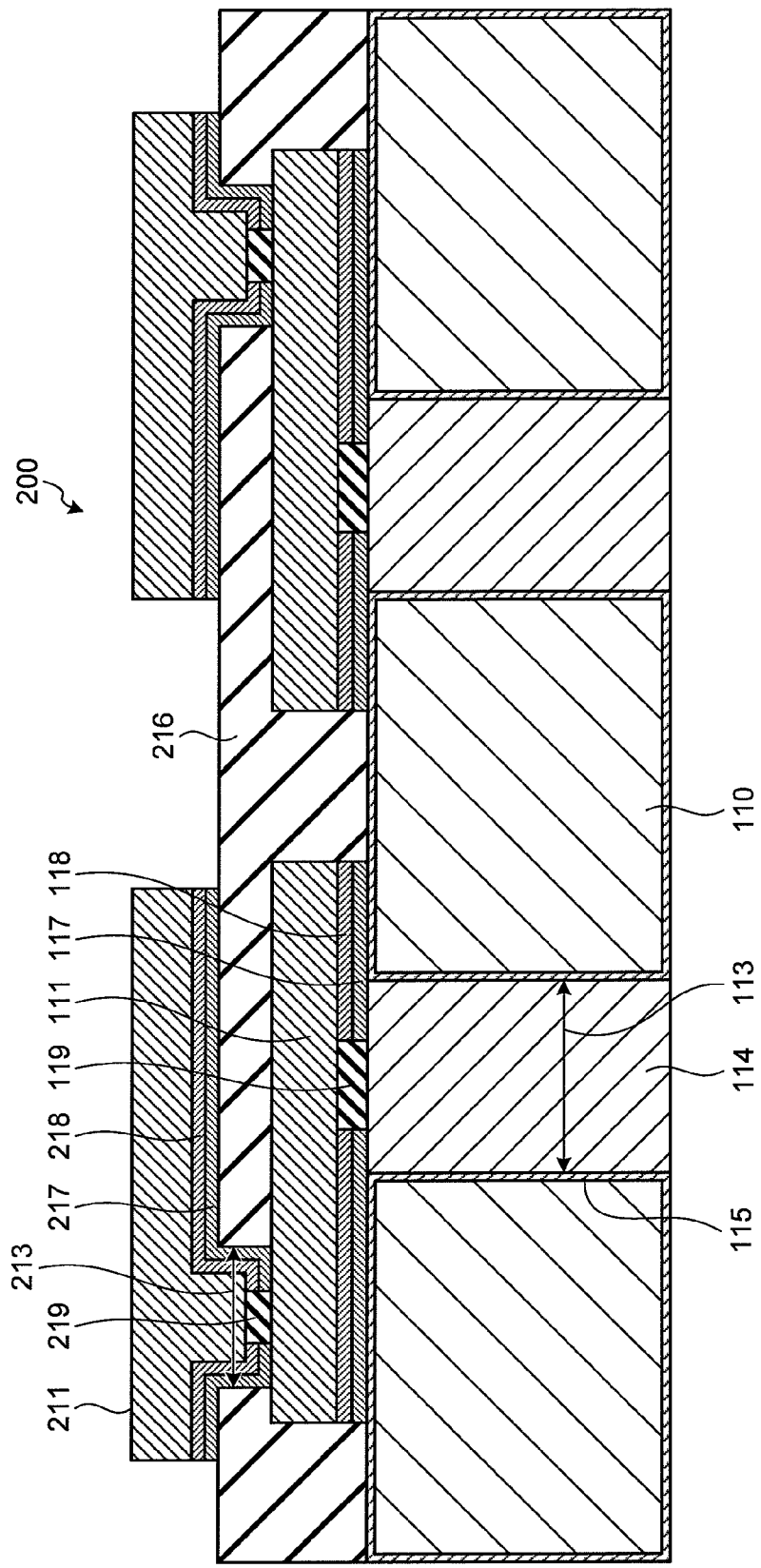

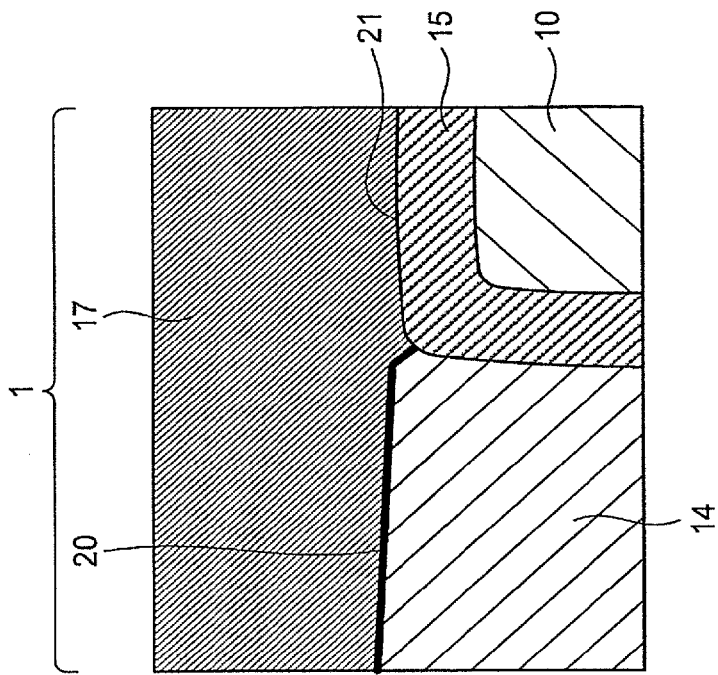
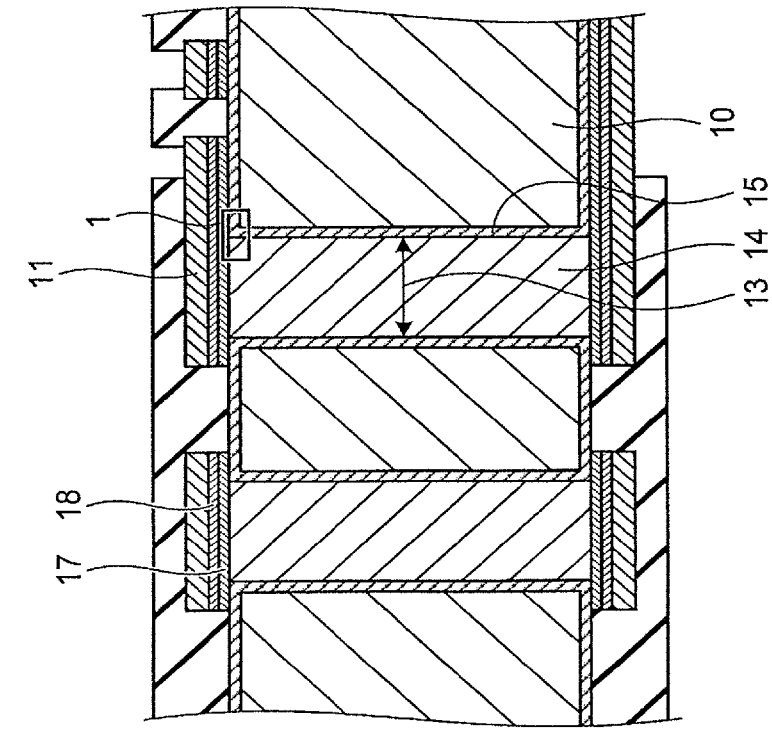

WIRING SUBSTRATE AND MANUFACTURING METHOD THEREOF

CROSS-REFERENCE TO RELATED APPLICATION

This application is based upon and claims the benefit of priority of the prior Japanese Patent Application No. 2010-130422, filed on Jun. 7, 2010, the entire contents of which are incorporated herein by reference.

FIELD

The embodiments discussed herein are directed to a wiring substrate and a manufacturing method of the wiring substrate.

BACKGROUND

In recent years, as a wiring substrate for use in a semiconductor device, a substrate having a multi-layer structure has been extensively used. The wiring substrate having the multi-layer structure is, for example, formed by stacking a plurality of wiring layers on a silicon substrate. In the wiring substrate, the wiring layers are stacked with insulating layers interposed every therebetween and are electrically connected to one other via electrode layers. An example of such a wiring substrate is a relay substrate called an interposer. The interposer, for example, is installed between a semiconductor element and a packaging substrate to electrically connect the semiconductor element to the packaging substrate.

FIG. 15 is a sectional view illustrating the structure of an interposer according to a related art. As illustrated in FIG. 15, for example, the interposer is formed using a silicon substrate 10 as a base. The interposer has a wiring pattern 11 on a surface and a wiring pattern 12 on the other surface. The wiring pattern 11 and the wiring pattern 12 are electrically connected to each other via a through electrode 14 formed in a through hole 13 passing through the silicon substrate 10. An oxide layer 15 serving as an insulating layer is formed on the outer surface of the silicon substrate 10 and the inner wall surface of the through hole 13. In addition, the surfaces of the wiring pattern 11 and the wiring pattern 12, for example, are coated with an insulating layer 16 made of polyimide.

In the wiring substrate having the multi-layer structure as described above, there is a situation in which an adhesive layer is formed between a wiring layer and an insulating layer or between a wiring layer and an electrode layer to improve the adhesion property between the layers. For example, in the interposer illustrated in FIG. 15, a titanium (Ti) layer 17 as an adhesive layer is formed between the wiring pattern 11 and the through electrode 14 and between the wiring pattern 11 and the oxide layer 15. Furthermore, a copper layer 18 is formed between the wiring pattern 11 and the titanium layer 17 as an underlayer of the wiring pattern 11. In addition, in the same manner, a titanium layer and a copper layer are also formed between the wiring pattern 12 and the through electrode 14 and between the wiring pattern 12 and the oxide layer 15.

The interposer, for example, is formed through a manufacturing method described below. FIGS. 16A to 16F are diagrams illustrating an example of a manufacturing method of an interposer according to a related art. FIGS. 16A to 16F illustrate the sections of the interposer in respective steps. First, as illustrated in FIG. 16A, thermal oxidation is performed to form an oxide layer 15 on the outer surface of a silicon substrate 10 and the inner wall surface of a through hole 13 formed in the silicon substrate 10. Then, a through electrode 14 is formed in the through hole 13.

As illustrated in FIG. 16B, a titanium layer 17 is formed on a surface of the silicon substrate 10 through sputtering. The titanium layer 17 serves as an adhesive layer between a wiring pattern 11 and the through electrode 14 and between the wiring pattern 11 and an oxide layer 15. Then, a copper layer 18 is formed on the titanium layer 17 through sputtering as an underlayer of the wiring pattern 11. As illustrated in FIG. 16C, a resist pattern 19 is formed on the copper layer 18. For example, the resist pattern 19 is formed by applying photoresist to the surface of the copper layer 18 and then exposing and developing the photoresist using a photomask.

As illustrated in FIG. 16D, the wiring pattern 11 is formed on the copper layer 18 through electrolytic copper plating. After the formation of the wiring pattern 11, the resist pattern 19 is stripped as illustrated in FIG. 16E. Next, as illustrated in FIG. 16F, etching is performed to remove the titanium layer 17 and the copper layer 18 located at places where the resist pattern 19 has been stripped off.

Through the manufacturing process as described above, the interposer comes to have the titanium layer 17 as an adhesive layer between the wiring pattern 11 and the through electrode 14 and between the wiring pattern 11 and the oxide layer 15. Furthermore, through the same process, the titanium layer as an adhesive layer is also formed between the wiring pattern 12, which is formed on the other surface of the silicon substrate 10, and the through electrode 14, and between the wiring pattern 12 and the oxide layer 15.

Patent Document 1: Japanese Laid-open Patent Publication No. 2009-277895.

SUMMARY

According to an aspect of the embodiment, a wiring substrate includes a wiring layer made of copper; an electrode layer made of copper; and an insulating layer arranged adjacent to the electrode layer, wherein the wiring layer is stacked on the electrode layer and the insulating layer, the insulating layer and the wiring layer are stacked with an adhesive layer interposed between the insulating layer and the wiring layer, and the electrode layer and the wiring layer are stacked with a copper alloy layer formed adjacent to the adhesive layer and interposed between the electrode layer and the wiring layer.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWING(S)

FIG. 1 is a sectional view illustrating the structure of an interposer according to a first embodiment;

FIG. 13 is a sectional view illustrating the structure of an interposer according to a third embodiment;

FIGS. 17A and 17B are diagrams for explaining problems of the related art.

DESCRIPTION OF EMBODIMENTS

As described previously, in the wiring substrate having the multi-layer structure as described above, there is a situation in which an adhesive layer is formed between a wiring layer and an insulating layer or between a wiring layer and an electrode layer to improve the adhesion property between the layers. However, in the above-described related art, a connection between an electrode layer (a through electrode) and a copper wiring layer may not be ensured as will be described below.

Figure 15:
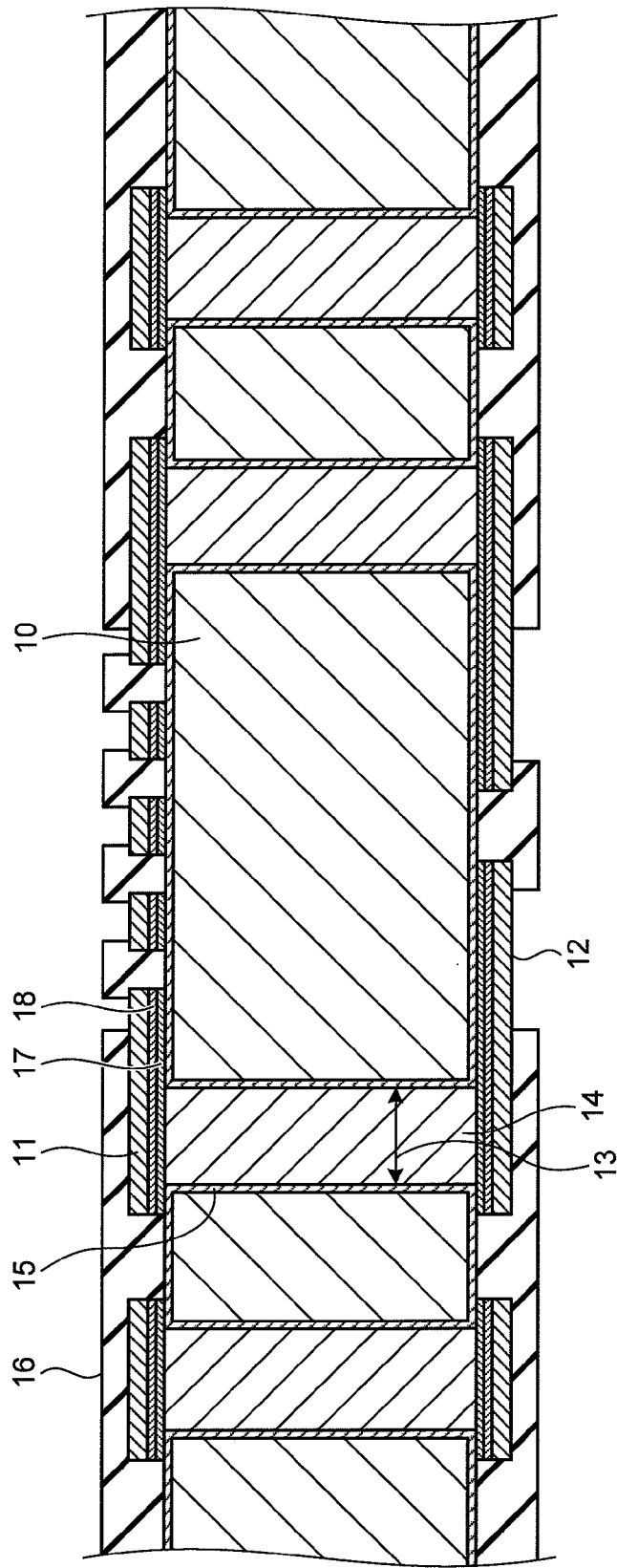
FIG. 15 is a sectional view illustrating the structure of an interposer according to a related art.
Figure 16A:
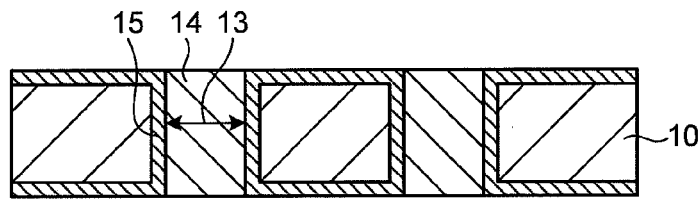
FIGS. 16A to 16F are diagrams illustrating an example of a manufacturing method of an interposer according to a related art.
Figure 16B:
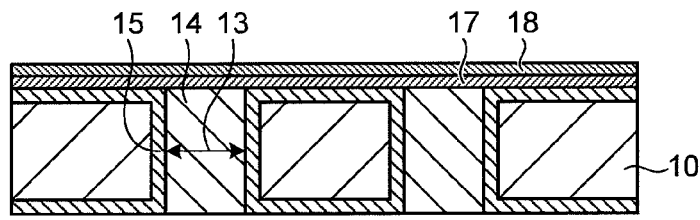
Figure 16C:
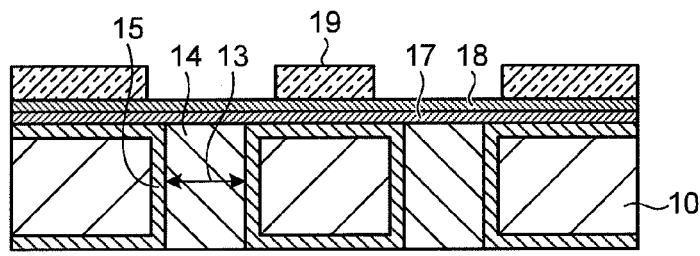
Figure 16D:
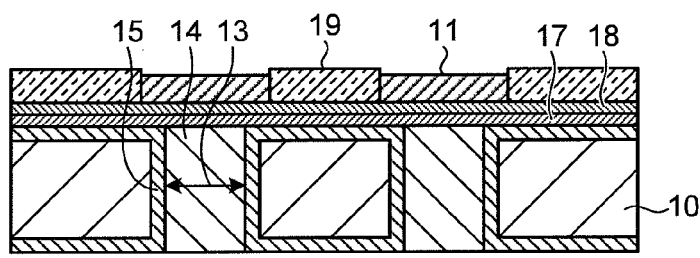
Figure 16E:
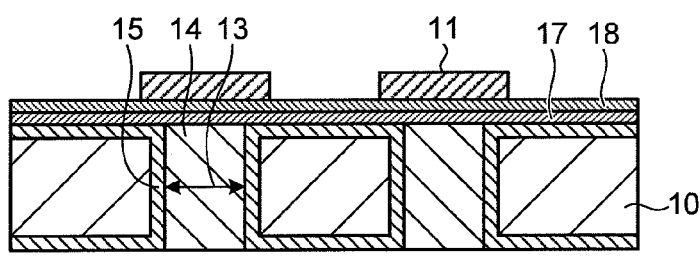
Figure 16F:
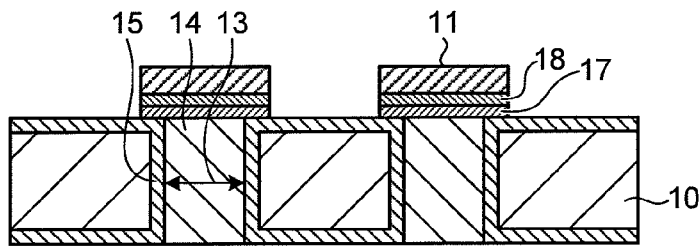

FIGS. 17A and 17B are diagrams for explaining the problem of the conventional art. FIG. 17A is a sectional view illustrating the vicinity of the through electrode 14 of the interposer illustrated in FIG. 15. Furthermore, FIG. 17B is an enlarged view illustrating a joining portion 1 between the oxide layer 15 and the titanium layer 17 illustrated in FIG. 17A. As illustrated in FIG. 17B, the through electrode 14 is joined with the titanium layer 17 at an interface 20, and the oxide layer 15 is joined with the titanium layer 17 at an interface 21.

The oxide layer 15 and the titanium layer 17 are reported to have high adhesion with respect to each other. On the other hand, since titanium is a metal which is not diffused into copper, adhesion between the through electrode 14 made of copper and the titanium layer 17 is lower than that between the oxide layer 15 and the titanium layer 17. Therefore, for example, when the interposer is repeatedly subjected to a thermal load, the through electrode 14, the oxide layer 15, and the titanium layer 17 with different thermal expansion coefficients repeatedly expand and contract. As a result, delamination may occur in the interface 20 between the through electrode 14 and the titanium layer 17. Due to the delamination, an electrical connection between the electrode layer and the copper wiring layer may not be ensured. In addition, when the wiring pattern 11 or the copper layer 18 is directly stacked on the oxide layer 15, delamination may occur between the oxide layer 15 and the wiring pattern 11 or between the oxide layer 15 and the copper layer 18.

The same problem may occur not only in the case where an insulating layer is an oxide layer and an adhesive layer is a titanium layer but also in the case where an insulating layer and an adhesive layer are made of different materials.

A wiring substrate and a manufacturing method of the wiring substrate according to preferred embodiments of the invention will be described in detail with reference to accompanying drawings. In addition, the following first to fourth embodiments are described with cases where the wiring substrate and the manufacturing method thereof are applied to an interposer. However, the technology disclosed herein is not limited thereto. Furthermore, in drawings referred in the following first to fourth embodiments, the same hatching is given for parts performing the same function.

[a] First Embodiment

Structure of Interposer According to First Embodiment

The structure of an interposer according to the first embodiment will be described first. FIG. 1 is a sectional view illustrating the structure of an interposer 100 according to a first embodiment. As illustrated in FIG. 1, the interposer 100 according to the first embodiment is formed using a silicon substrate 110 as a base and includes a wiring pattern 111 and a wiring pattern 112. The wiring pattern 111 is formed on a surface of the silicon substrate 110. The wiring pattern 112 is formed on the other surface of the silicon substrate 110. Furthermore, the interposer 100 includes a through electrode 114 formed in a through hole 113 passing through the silicon substrate 110. The through electrode 114 electrically connects the wiring pattern 111 to the wiring pattern 112.

Then, an oxide layer 115 serving as an insulating layer is formed on the outer surface of the silicon substrate 110 and the inner wall surface of the through hole 113. Furthermore, a titanium (Ti) layer 117 serving as an adhesive layer is formed between the wiring pattern 111 and the oxide layer 115. Furthermore, a copper layer 118 serving as an underlayer of the wiring pattern 111 is formed between the wiring pattern 111 and the titanium layer 117. In addition, in the same manner, a titanium layer and a copper layer are also formed between the wiring pattern 112 and the oxide layer 115. Moreover, the surfaces of the wiring pattern 111 and the wiring pattern 112, for example, are coated with an insulating layer 116 made of polyimide.

In the interposer 100, the wiring pattern 111 is made of copper and the through electrode 114 is also made of copper. Furthermore, the oxide layer 115 is disposed adjacent to the through electrode 114. Furthermore, the wiring pattern 111 is stacked on the through electrode 114 and the oxide layer 115. Moreover, the oxide layer 115 and the wiring pattern 111 are stacked with the titanium layer 117 as an adhesive layer interposed therebetween. Furthermore, the through electrode 114 and the wiring pattern 111 are stacked with a copper alloy layer 119 interposed therebetween, in which the copper alloy layer 119 is formed adjacent to the titanium layer 117. In addition, in the same manner, the wiring pattern 112 is also stacked on the through electrode 114 with the copper alloy layer interposed therebetween.

That is, in the interposer 100 according to the first embodiment, the titanium layer 117 having high adhesion property to the oxide layer 115 is stacked on the oxide layer 115. Meanwhile, the wiring pattern 111 is stacked on the through electrode 114 with the copper alloy layer 119 interposed therebetween. Here, an alloy is formed at the interface between the through electrode 114 and the copper alloy layer 119 and the interface between the wiring pattern 111 and the copper alloy layer 119, so that they have high adhesion property. Consequently, according to the first embodiment, it is possible to ensure a connection between the through electrode 114 (an electrode layer) and the wiring pattern 111 (a copper wiring layer) while maintaining adhesion property between the oxide layer 115 (an insulating layer) and the titanium layer 117. Furthermore, since the through electrode 114 and the wiring pattern 111 are stacked without the titanium layer 117 interposed therebetween, no delamination occurs in the interface between the through electrode 114 and the titanium layer 117.

Manufacturing Method of Interposer According to First Embodiment

Next, a manufacturing method of the interposer 100 according to the first embodiment will be described. FIGS. 2A to 2G are diagrams illustrating the manufacturing method of the interposer 100 according to the first embodiment. FIGS. 2A to 2G illustrate the sections of the interposer 100 in each step.

Figure 2A:
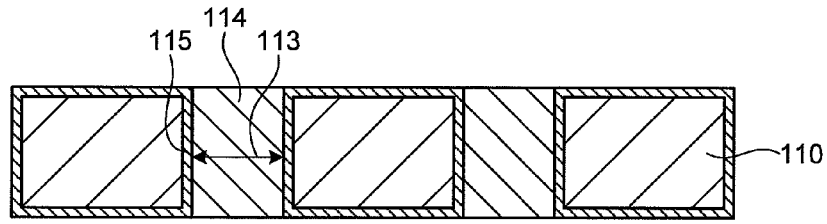
FIGS. 2A to 2G are diagrams illustrating a manufacturing method of an interposer according to a first embodiment.

First, as illustrated in FIG. 2A, the oxide layer 115 is formed on the outer surface of the silicon substrate 110 and the inner wall surface of the through hole 113 formed in the silicon substrate 110. For example, the oxide layer 115 is formed by forming a silicon dioxide ($SiO_2$) layer through thermal oxidation on the outer surface of the silicon substrate 110 and the inner wall surface of the through hole 113. For example, when the silicon substrate 110 has a thickness of about 200 µm, the through hole 113 is formed with a diameter of about 20 µm to about 100 µm. Furthermore, an interval between through holes 113 is about 50 µm to about 400 µm. Furthermore, the oxide layer 115 is formed to have a thickness of about 1 µm to about 2 µm. After the oxide layer 115 is formed, the through electrode 114 is formed in the through hole 113. For example, the through electrode 114 is formed by filling the through hole 113 with copper plating by a method of electrolytic copper plating. As a result of forming the through electrode 114 as described above, the through electrode 114 and the oxide layer 115 are arranged adjacent to each other in the vicinity of the outer surface of the silicon substrate 110 and the through electrode 114.

Figure 2B:
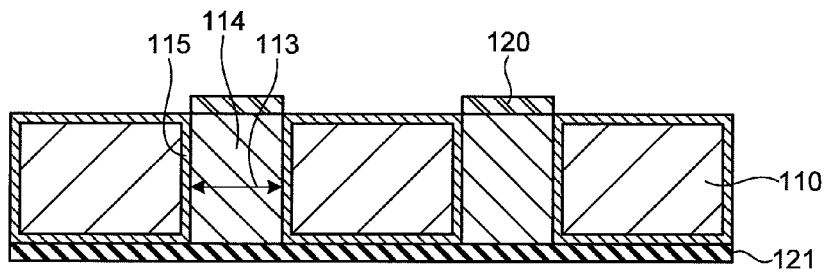

As illustrated in FIG. 2B, a metal layer alloyable with copper is formed on the surface (the end surface) of the through electrode 114. In the first embodiment, a tin (Sn) layer 120 is formed as the metal layer. For example, the tin layer 120 is formed through electroless tin plating, electrolytic tin plating, solder ball mounting, solder paste printing, or the like. The solder ball and the solder paste contain tin. In addition, in the case of applying the electroless tin plating, a protective layer 121 is formed in advance on the opposite surface of the through electrode 114 to prevent a tin layer from being formed on the opposite surface thereof. For example, as the protective layer 121, a protective tape adheres to the opposite surface of the through electrode 114.

Figure 3A:
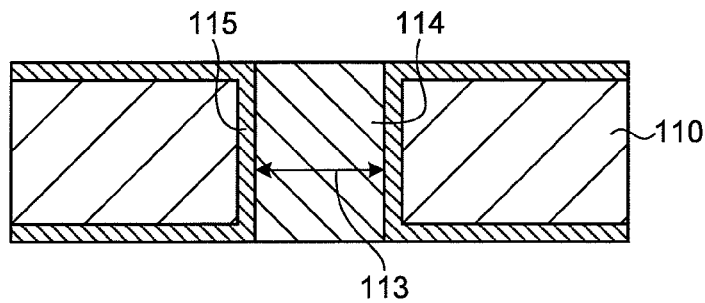
FIGS. 3A to 3C are diagrams for explaining the formation of a tin layer according to the first embodiment.
Figure 3B:
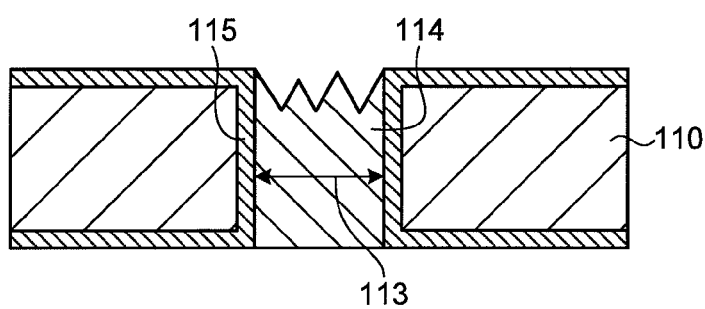
Figure 3C:
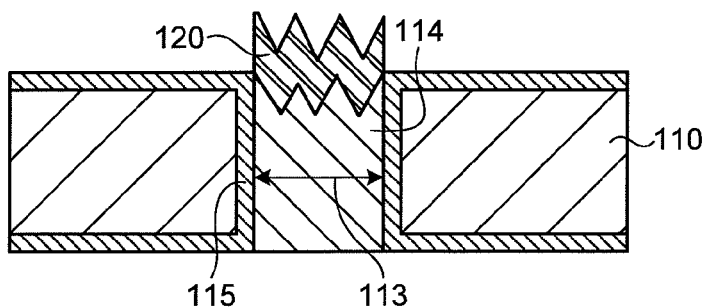

In addition, in the first embodiment, before the tin layer 120 is formed on the surface of the through electrode 114, convex sections and concave sections are formed on the surface of the through electrode 114 through a roughening treatment. FIGS. 3A to 3C are diagrams explaining the formation of the tin layer 120 according to the first embodiment. FIG. 3A illustrates the state of the through electrode 114 before being subject to the roughening treatment. Furthermore, FIG. 3B illustrates the state of the through electrode 114 after being subject to the roughening treatment. Furthermore, FIG. 3C illustrates the states of the through electrode 114 and the tin layer 120 formed on the through electrode 114.

As illustrated in FIGS. 3A and 3B, in the first embodiment, the surface of the through electrode 114 is subject to the roughening treatment, so that a plurality of convex and concave sections are formed on the surface of the through electrode 114. For example, as the roughening treatment, dry etching, wet etching, milling and the like are performed.

In addition, the roughening treatment, for example, is performed such that the through electrode 114 has a surface roughness Ra of about 10 nm to about 500 nm. Preferably, the roughening treatment is performed such that the through electrode 114 has a surface roughness Ra of 100 nm. If the tin layer 120 is formed on the surface of the through electrode 114 after the roughening treatment is performed, convex and concave sections are also formed on the surface of the tin layer 120 to follow the shape of the surface of the through electrode 114 as illustrated in FIG. 3c.

Figure 2C:
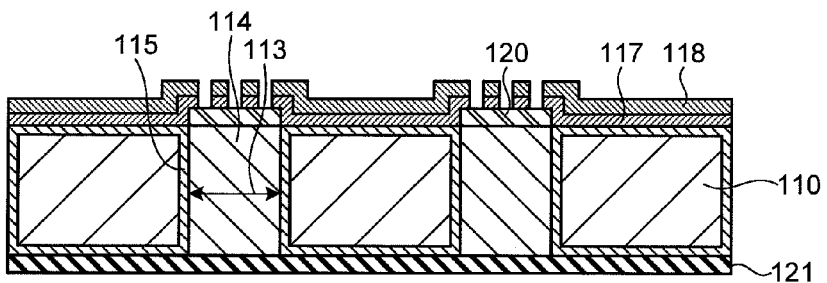

As illustrated in FIG. 2C, the titanium layer 117 is formed over the whole surface of the oxide layer 115 and on a portion of the surface of the tin layer 120. In addition, the copper layer 118 serving as an underlayer of the wiring pattern 111 is formed on the surface of the titanium layer 117.

Figure 4:
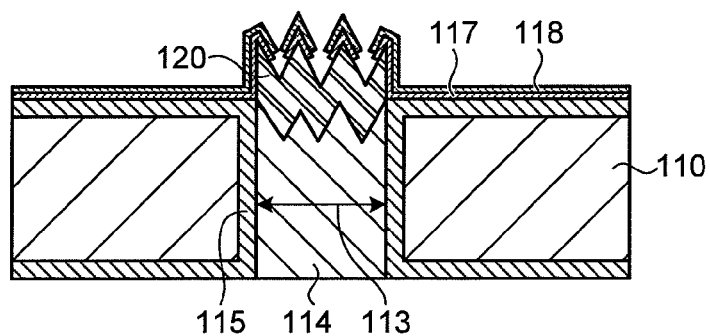
FIG. 4 is a first diagram for explaining the sputtering of a titanium layer and a copper layer according to the first embodiment.
Figure 5:
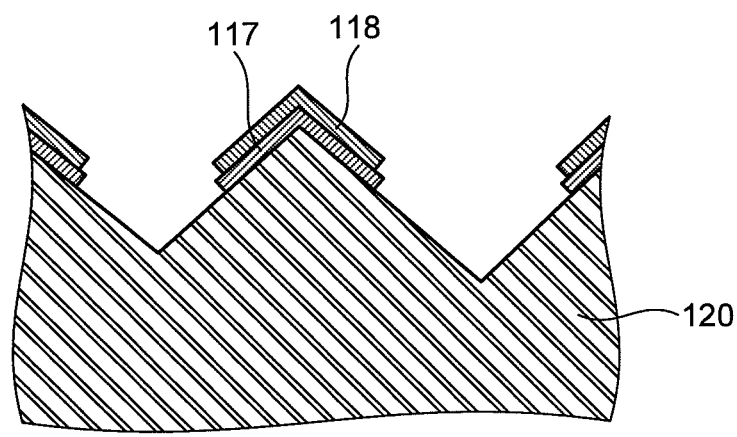
FIG. 5 is a second diagram for explaining the sputtering of a titanium layer and a copper layer according to the first embodiment.
Figure 6:
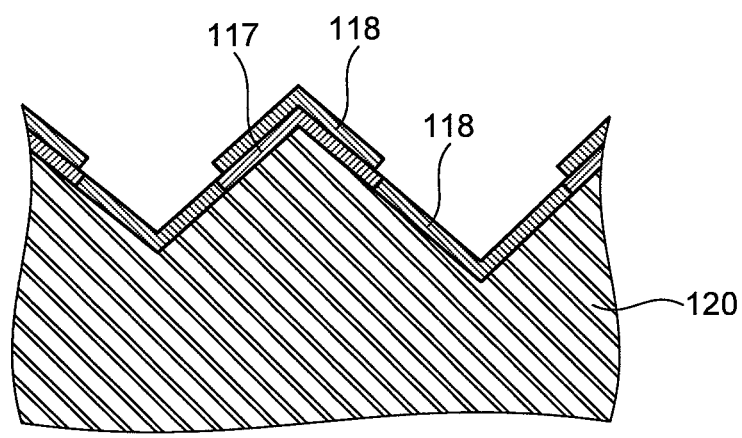
FIG. 6 is a third diagram for explaining the sputtering of a titanium layer and a copper layer according to the first embodiment.

In addition, in the first embodiment, the titanium layer 117 and the copper layer 118 are formed through sputtering. FIGS. 4 to 6 are diagrams explaining the sputtering of the titanium layer 117 and the copper layer 118 according to the first embodiment. FIG. 4 illustrates the states of the titanium layer 117 and the copper layer 118 formed on the surface of the tin layer 120 through the sputtering. Furthermore, FIGS. 5 and 6 illustrate detailed states of the titanium layer 117 and the copper layer 118 formed on the surface of the tin layer 120.

As illustrated in FIG. 4, the titanium layer 117 and the copper layer 118 are formed on the surface of the tin layer 120 roughened on the through electrode 114. For example, the titanium layer 117 is formed with a thickness of about 10 nm to about 50 nm through the sputtering. Furthermore, the copper layer 118 is formed with a thickness of about 100 nm to about 500 nm through the sputtering.

In this way, as illustrated in FIG. 5, titanium (a material of the titanium layer 117) and copper (a material of the copper layer 118) adhere to the convex sections formed on the surface of the tin layer 120, respectively. As a consequence, the titanium layer 117 and the copper layer 118 are formed on part of the surface of the tin layer 120. As described above, since the titanium layer 117 and the copper layer 118 are formed, when the wiring pattern 111 is formed on the titanium layer 117 and the copper layer 118 through electrolytic copper plating later, it is possible to allow the concave section formed on the surface of the tin layer 120 to make contact with the wiring pattern 111.

In addition, as described herein, the purpose of forming the convex and concave sections on the surface of the tin layer 120 is to allow copper (a material of the wiring pattern 111) to make contact with the tin layer 120. In this regard, as illustrated in FIG. 6, the titanium layer 117 may adhere to the convex section of the tin layer 120, and the copper layer 118 may adhere to the convex section and the concave section of the tin layer 120.

Figure 2D:
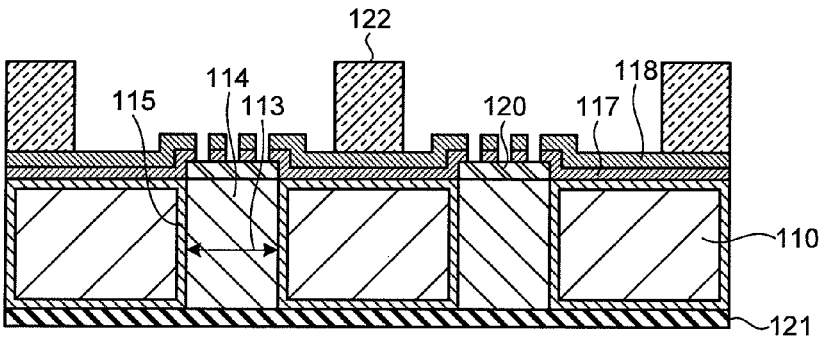

As illustrated in FIG. 2D, a resist pattern 122 with an opening hole at the position, where the wiring pattern 111 is to be formed, is formed on the copper layer 118. For example, the resist pattern 122 is formed by applying photoresist onto the surface of the copper layer 118 and then exposing and developing the photoresist using a photomask.

Figure 2E:
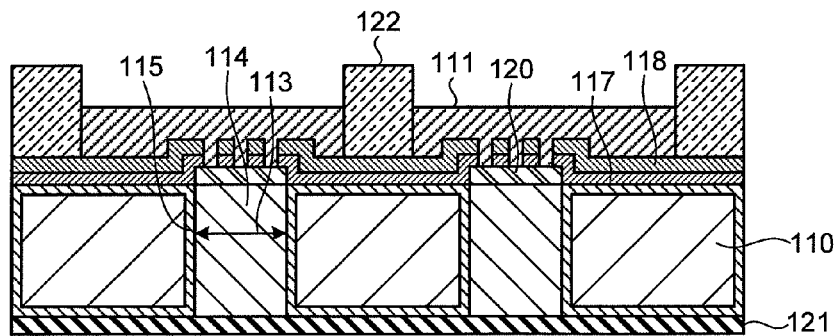
Figure 7:
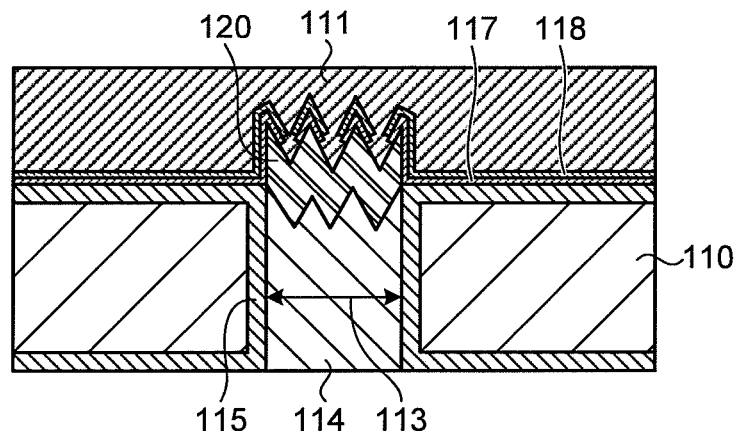
FIG. 7 is a diagram illustrating the state obtained after the formation of a wiring pattern according to the first embodiment.

As illustrated in FIG. 2E, the wiring pattern 111 is formed on the surface of the copper layer 118. At this time, the wiring pattern 111 is also formed on an exposed surface of the tin layer 120 on which the titanium layer 117 and the copper layer 118 are not formed. FIG. 7 is a diagram illustrating the state after the wiring pattern 111 is formed according to the first embodiment. As illustrated in FIG. 7, the wiring pattern 111 is formed on the surface of the copper layer 118. For example, the wiring pattern 111 is formed through electrolytic copper plating using the titanium layer 117 and the copper layer 118 as a power feeding layer. Here, as mentioned before, in the present embodiment, the titanium layer 117 and the copper layer 118 are formed on part of the surface of the tin layer 120. For this reason, the wiring pattern 111 is also formed on the surface of the exposed surface of the tin layer 120 on which the titanium layer 117 and the copper layer 118 are not formed.

Figure 8:
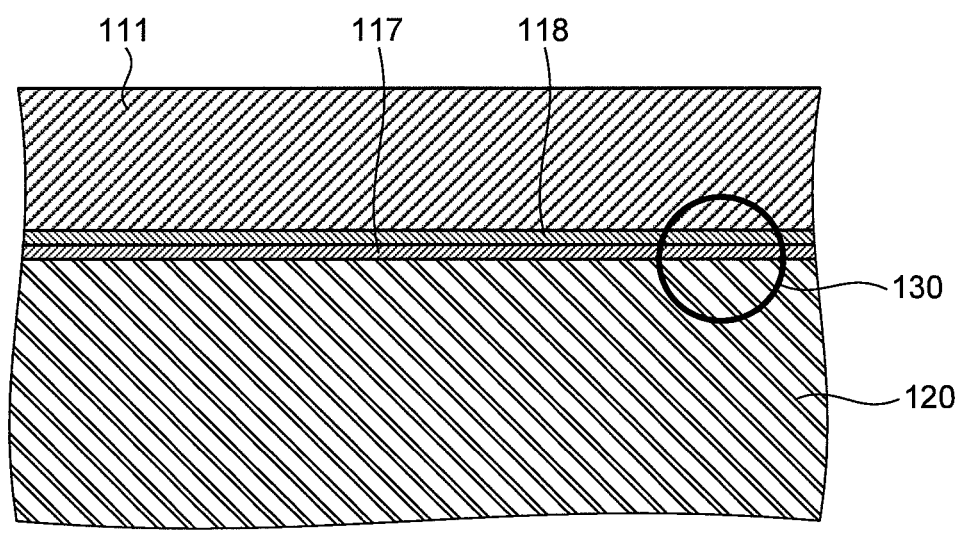
FIG. 8 is a diagram illustrating an example compared with the state of a surface of a tin layer according to the first embodiment.

Hereinafter, the state of the surface of the tin layer 120 according to the first embodiment will be described in detail. FIG. 8 is a diagram illustrating an example compared with the state of the surface of the tin layer 120 according to the first embodiment. When the surface of the tin layer 120 is flat, the titanium layer 117 and the copper layer 118 are uniformly formed on the surface of the tin layer 120 like the part surrounded by a circle 130 as illustrated in FIG. 8. In general, titanium has been known as a metal that prevents the diffusion of other metals. For this reason, when the titanium layer 117 is uniformly formed between the wiring pattern 111 and the tin layer 120, an alloy of copper and tin is not easily formed.

Figure 9:
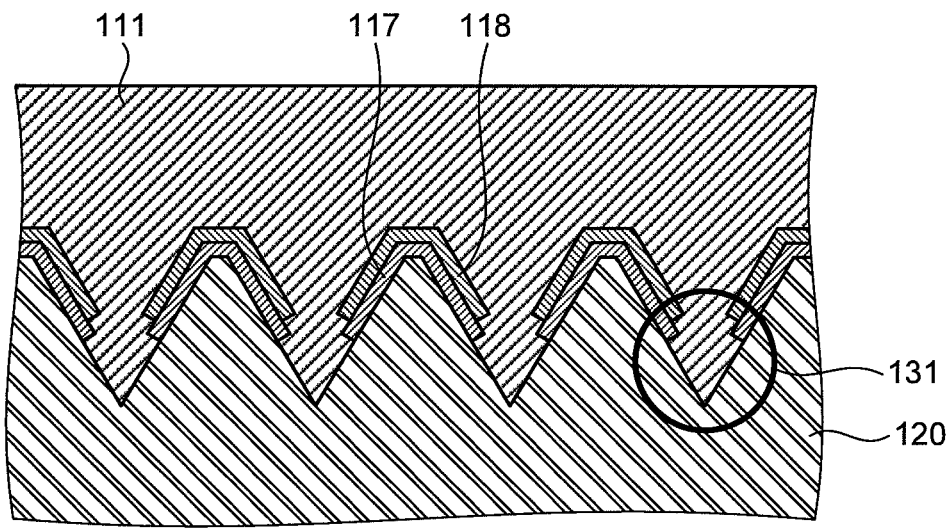
FIG. 9 is a diagram illustrating the state of the surface of a tin layer according to the first embodiment.

However, in the first embodiment, the convex sections and the concave sections are formed on the surface of the tin layer 120 through the roughening treatment, and the titanium layer 117 and the copper layer 118 are formed on the convex sections formed on the surface of the tin layer 120. FIG. 9 is a diagram illustrating the state of the surface of the tin layer 120 according to the first embodiment. If the wiring pattern 111 is formed through electrolytic copper plating, the convex sections formed on the surface of the tin layer 120 make contact with the wiring pattern 111 as in the part surrounded by a circle 131 illustrated in FIG. 9. As described above, the titanium layer 117 and the copper layer 118 are formed such that the tin layer 120 makes contact with the wiring pattern 111, so that an alloy of copper and tin is easily formed when a heat treatment is applied to the tin layer 120 later.

In addition, FIG. 9 illustrates the state where the titanium layer 117 and the copper layer 118 are formed only on the convex sections formed on the surface of the tin layer 120. However, if it is possible to generate an alloy in an amount sufficient to form the copper alloy layer 119, the titanium layer 117 and the copper layer 118 may be formed on part of the plurality of concave sections formed on the surface of the tin layer 120. That is, if it is possible to ensure an area of the contact surface between the tin layer 120 and the wiring pattern 111, which is sufficient to form the copper alloy layer 119, the titanium layer 117 and the copper layer 118 may be formed on part of the plurality of concave sections.

Furthermore, in the case where it is impossible to thinly form the titanium layer 117 and the copper layer 118 when forming the titanium layer 117 and the copper layer 118 through the sputtering, the wiring pattern 111 may not sufficiently make contact with the tin layer 120. In such a case, for example, before forming the wiring pattern 111, the titanium layer 117 and the copper layer 118 formed on the tin layer 120 may be polished through chemical mechanical polishing (CMP), so that the convex sections formed on the surface of the tin layer 120 may be exposed. In this way, since the area of the contact surface between the wiring pattern 111 and the tin layer 120 is increased, an alloy of copper and tin is easily formed.

Figure 2F:
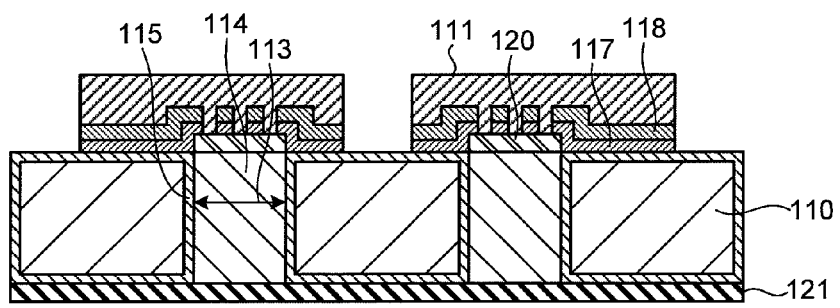

As illustrated in FIG. 2F, the resist pattern 122 is stripped off. Then, the titanium layer 117 and the copper layer 118 are removed, which exist at the place where the resist pattern 122 has been stripped off. For example, the titanium layer 117 and the copper layer 118 are removed through dry etching, wet etching, milling, or the like.

Figure 2G:
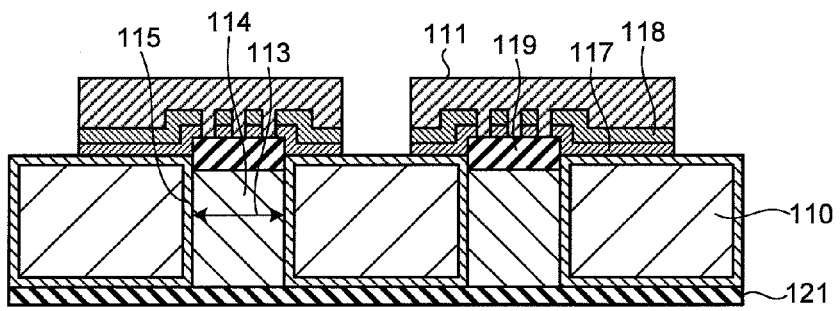

As illustrated in FIG. 2G, the tin layer 120 is subject to a heat treatment, so that the copper alloy layer 119 is formed between the through electrode 114 and the wiring pattern 111. In the first embodiment, the copper alloy layer 119 is made of an alloy of copper and tin.

Figure 10:
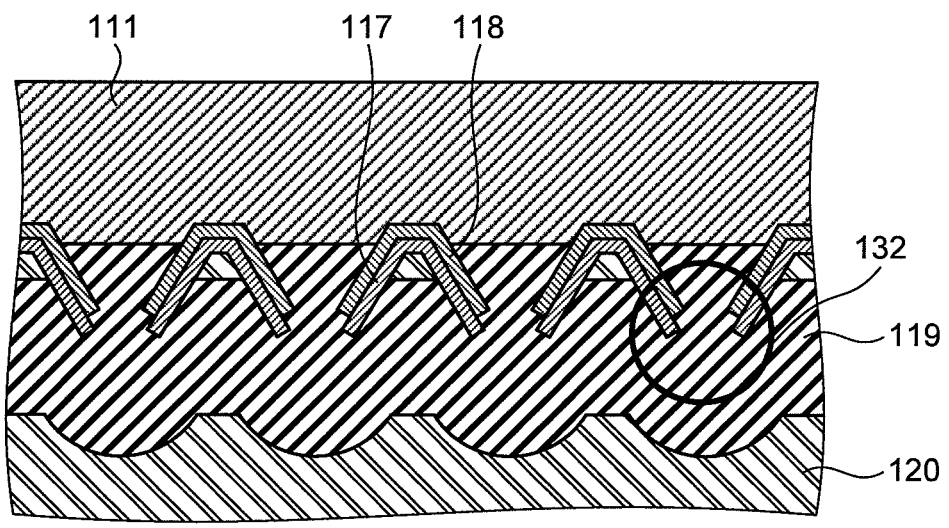
FIG. 10 is a diagram illustrating a copper alloy layer according to the first embodiment.

FIG. 10 is a diagram illustrating the copper alloy layer 119 according to the first embodiment. FIG. 10 illustrates the state of the copper alloy layer 119 formed by applying the heat treatment to the tin layer 120. As mentioned before, in the first embodiment, the titanium layer 117 and the copper layer 118 are formed on the convex sections formed on the surface of the tin layer 120, so that the concave sections formed on the surface of the tin layer 120 make contact with the wiring pattern 111. Thus, when the tin layer 120 is subject to the heat treatment, an alloy of copper and tin is formed around the contact portions between the tin layer 120 and the wiring pattern 111 as in the part surrounded by a circle 132 illustrated in FIG. 10. Meanwhile, in the same manner, an alloy of copper and tin is also formed around the contact portions between the tin layer 120 and the through electrode 114. In this way, the copper alloy layer 119 is formed at the interface between the tin layer 120 and the wiring pattern 111 and the interface between tin layer 120 and the through electrode 114.

As described above, the copper alloy layer 119 is formed at the interface between the tin layer 120 and the wiring pattern 111 and the interface between tin layer 120 and the through electrode 114, so that adhesion property between the tin layer 120 and the copper alloy layer 119 and adhesion property between the tin layer 120 and the wiring pattern 111 improve. In this way, an electrical connection between the through electrode 114 and the wiring pattern 111 is ensured. In addition, the range in which the copper alloy layer 119 is formed may be limited to only the vicinity of the interface between the tin layer 120 and the through electrode 114 and only the vicinity of the interface between the tin layer 120 and the wiring pattern 111, or may be the whole of the tin layer 120.

Through the above-described manufacturing process, the wiring pattern 111, the titanium layer 117, the copper layer 118, and the copper alloy layer 119 are formed on a surface of the silicon substrate 110. Furthermore, after the protective layer 121 is stripped off, the wiring pattern 112, the titanium layer, the copper layer, and the copper alloy layer are formed on the other surface of the silicon substrate 110 through the same process. Consequently, the interposer 100 illustrated in FIG. 1 is obtained.

Effects of First Embodiment

As described above, the interposer 100 according to the first embodiment includes the wiring pattern 111 made of copper. Furthermore, the interposer 100 includes the through electrode 114 made of copper. Furthermore, the interposer 100 includes the oxide layer 115 arranged adjacent to the through electrode 114. Furthermore, the wiring pattern 111 is stacked on the through electrode 114 and the oxide layer 115. The oxide layer 115 and the wiring pattern 111 are stacked with the titanium layer 117 interposed therebetween. Furthermore, the through electrode 114 and the wiring pattern 111 are stacked with the copper alloy layer 119 interposed therebetween where the copper alloy layer 119 is formed adjacent to the oxide layer 115. Consequently, according to the first embodiment, it is possible to ensure a connection between the through electrode 114 and the wiring pattern 111 while maintaining adhesion property between the oxide layer 115 and the titanium layer 117. Furthermore, since the through electrode 114 and the wiring pattern 111 are stacked without the titanium layer 117 interposed therebetween, no delamination occurs in the interface between the through electrode 114 and the titanium layer 117.

Furthermore, in the manufacturing method of the interposer 100 according to the first embodiment, the tin layer 120 is formed on the surface of the through electrode 114 arranged adjacent to the oxide layer 115. Furthermore, the titanium layer 117 is formed over the whole surface of the oxide layer 115 and on part of the surface of the tin layer 120. Furthermore, the wiring pattern 111 is formed on the surface of the titanium layer 117 and the exposed surface of the tin layer 120 on which the titanium layer 117 is not formed. Furthermore, the tin layer 120 is subject to the heat treatment, so that the copper alloy layer 119 is formed between the through electrode 114 and the wiring pattern 111. Consequently, according to the first embodiment, it is possible to obtain the interposer 100 capable of ensuring a connection between the through electrode 114 and the wiring pattern 111 while maintaining adhesion property between the oxide layer 115 and the titanium layer 117.

Furthermore, in the manufacturing method of the interposer 100 according to the first embodiment, the convex sections and the concave sections are formed on the surface of the through electrode 114 through the roughening treatment before the tin layer 120 is formed. Furthermore, the convex sections and the concave sections are formed on the surface of the tin layer 120 to follow the shape of the surface of the through electrode 114. Furthermore, the titanium layer 117 is formed through the sputtering and the material of the titanium layer 117 adheres to the convex sections formed on the surface of the tin layer 120, so that the titanium layer 117 is partially formed on the surface of the tin layer 120. Consequently, according to the first embodiment, since it is not necessary to perform the roughening treatment with respect to the surface of the tin layer 120, it is possible to easily obtain the interposer 100 capable of ensuring a connection between the through electrode 114 and the wiring patterns 111.

[b] Second Embodiment

In the manufacturing method of the interposer 100 according to the first embodiment, the example has been described, in which the convex sections and the concave sections are formed on the surface of the tin layer 120 formed on the surface of the through electrode 114 by performing the roughening treatment with respect to the surface of the through electrode 114. However, the technology disclosed herein is not limited thereto. That is, it is possible to form the convex sections and the concave sections on the surface of the tin layer 120 without performing the roughening treatment with respect to the surface of the through electrode 114. Hereinafter, an example in which the convex sections and the concave sections are formed on the surface of the tin layer 120 by adjusting the thickness of the tin layer 120 according to the second embodiment will be described.

Manufacturing Method of Interposer According to Second Embodiment

The overall flow of a manufacturing method of the interposer 100 according to the second embodiment is basically equal to those illustrated in FIGS. 2A to 2G. However, a process of forming the through electrode 114 and a process of forming the adhesive layer are different from the manufacturing method described in the first embodiment.

First, similarly to the first embodiment, an oxide layer 115 is formed on the outer surface of a silicon substrate 110 and the inner wall surface of a through hole 113 formed in the silicon substrate 110. After the oxide layer 115 is formed, a through electrode 114 is formed in the through hole 113. As a result of forming the through electrode 114 as described above, the through electrode 114 and the oxide layer 115 are arranged adjacent to each other in the vicinity of the outer surfaces of the silicon substrate 110 and the through electrode 114 (see FIG. 2A). In the second embodiment, no roughening treatment is performed with respect to the surface of the through electrode 114.

A metal layer alloyable with copper is formed on the surface of the through electrode 114. In the second embodiment, similarly to the first embodiment, a tin layer 120 is formed as a metal layer. For example, the tin layer 120 is formed through electroless tin plating, electrolytic tin plating, solder ball mounting, solder paste printing, or the like. The solder ball and the solder paste contain tin. In addition, in the case of applying the electroless tin plating, the protective layer 121 is formed in advance on the opposite surface of the through electrode 114 in order to prevent a tin layer from being formed on the opposite surface thereof.

Figure 11A:
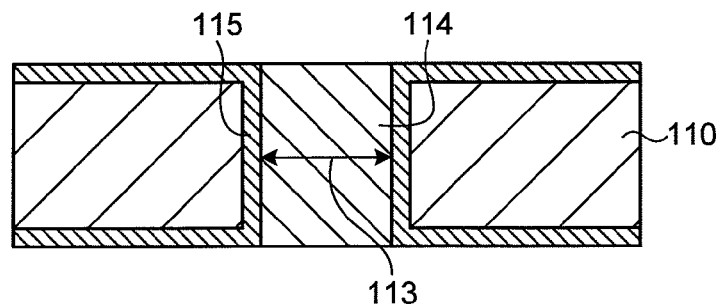
FIGS. 11A to 11D are diagrams explaining the formation of a tin layer according to a second embodiment.
Figure 11B:
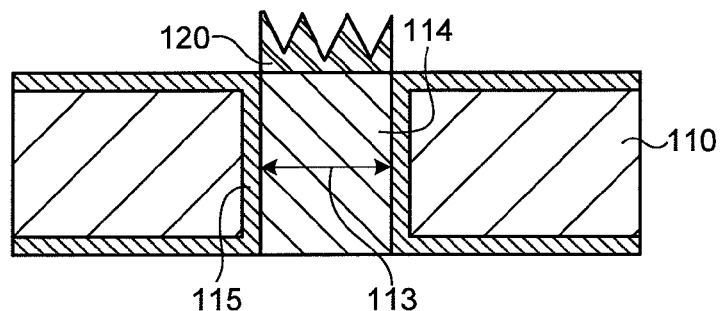
Figure 11C:
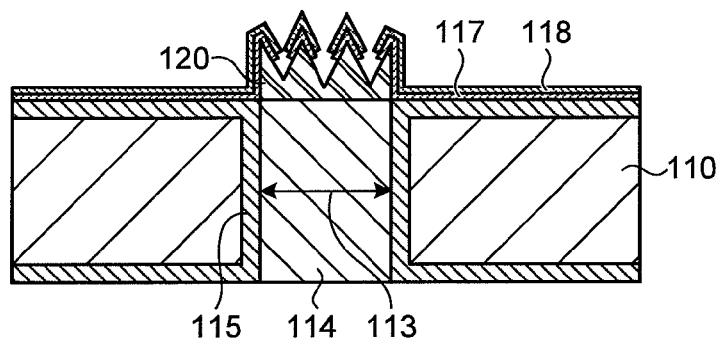
Figure 11D:
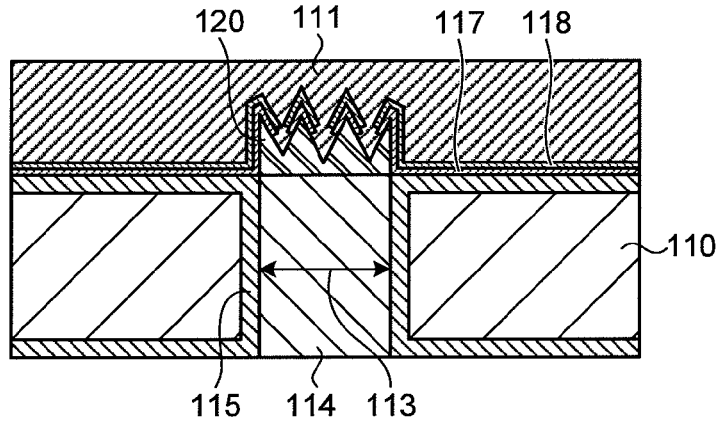

FIGS. 11A to 11D are diagrams for explaining the formation of the tin layer 120 according to the second embodiment. FIG. 11A illustrates the state of the through electrode 114 before the tin layer 120 is formed. Furthermore, FIG. 11B illustrates the states of the through electrode 114 and the tin layer 120 formed on the surface of the through electrode 114. Furthermore, FIG. 11C illustrates the states of the titanium layer 117 and the copper layer 118 which are formed on the surface of the tin layer 120 through sputtering. Furthermore, FIG. 11D illustrates the state of the wiring pattern 111 formed on the tin layer 120.

As illustrated in FIGS. 11A and 11B, the tin layer 120 is formed on the surface of the through electrode 114. In the second embodiment, the tin layer 120 is formed to have a thickness sufficient to form convex sections and concave sections on the surface thereof. In addition, the tin layer 120, for example, is formed to have a surface roughness Ra of about 10 nm to about 500 nm. Preferably, the tin layer 120 is formed to have a surface roughness Ra of 100 nm.

Figure 12C:
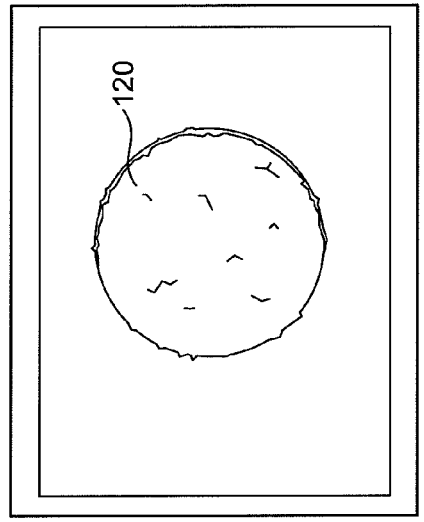
FIGS. 12A to 12E are diagrams illustrating the relationship between the thickness of a tin layer and the shape of the surface of the tin layer according to a second embodiment.
Figure 12B:
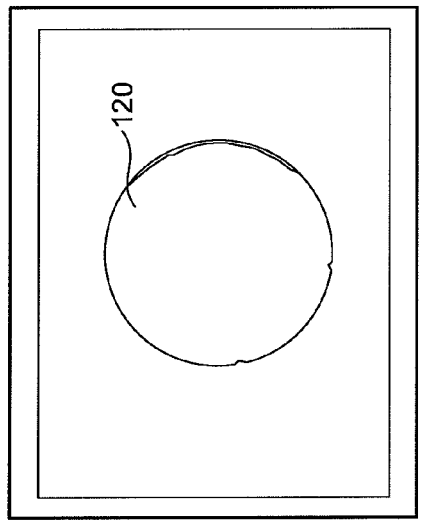
Figure 12E:
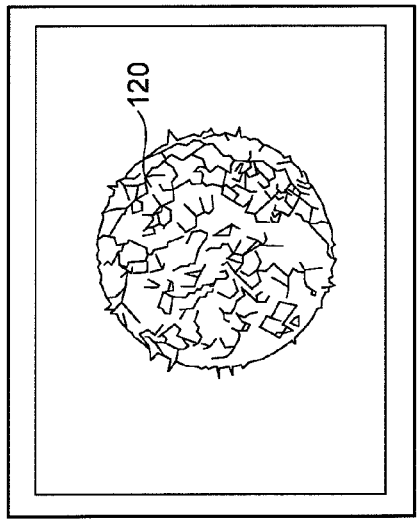
Figure 12A:
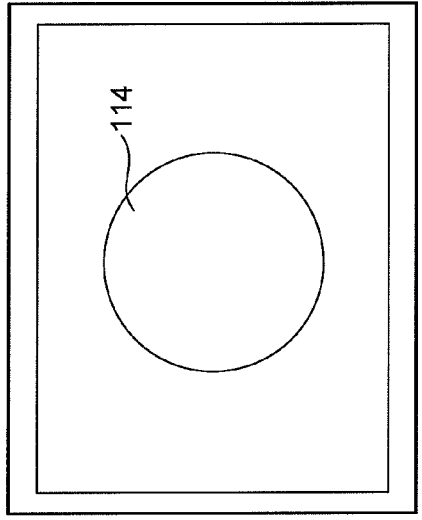

FIGS. 12A to 12E are diagrams illustrating the relationship between the thickness of the tin layer 120 and the shape of the surface of the tin layer 120 according to the second embodiment. FIG. 12A illustrates the shape of the surface of the through electrode 114 before the tin layer 120 is formed. Furthermore, FIGS. 12B to 12E illustrate the shape of the surface of the tin layer 120 formed on the through electrode 114.

Figure 12D:
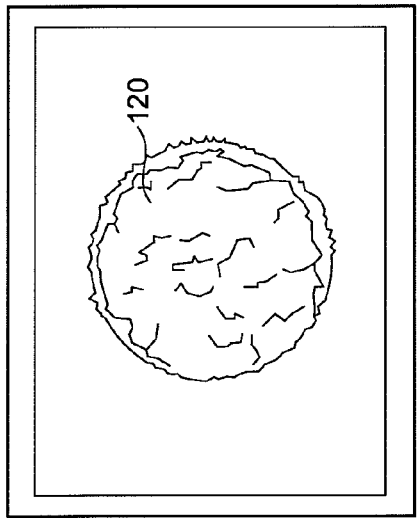

In detail, FIG. 12B illustrates the shape of the surface of the tin layer 120 formed through sputtering for obtaining the thickness of 0.05 μm. Furthermore, FIG. 12C illustrates the shape of the surface of the tin layer 120 formed through sputtering for obtaining the thickness of 1 μm. Furthermore, FIG. 12D illustrates the shape of the surface of the tin layer 120 formed through sputtering for obtaining the thickness of 3 μm. Furthermore, FIG. 12D illustrates the shape of the surface of the tin layer 120 formed through sputtering for obtaining the thickness of 5 μm.

As illustrated in FIGS. 12A to 12E, the surface of the tin layer 120 is gradually roughened as the thickness thereof increases. Consequently, the thickness of the tin layer 120 formed on the through electrode 114 appropriately increases, so that convex sections and concave sections are formed on the surface of the tin layer 120. For example, the tin layer 120 is formed to have a thickness of 5 μm.

Similarly to the first embodiment, the titanium layer 117 is formed entirely over the whole surface of the oxide layer 115 and partially on the surface of the tin layer 120. In addition, the copper layer 118 serving as an underlayer of the wiring pattern 111 is formed on the surface of the titanium layer 117 (see FIG. 2C). For example, the titanium layer 117 is formed to have a thickness of about 10 nm to about 50 nm through the sputtering. Furthermore, the copper layer 118 is formed to have a thickness of about 100 nm to about 500 nm through the sputtering. As a consequence, as illustrated in FIG. 11C, the titanium layer 117 and the copper layer 118 are formed partially on the surface of the tin layer 120.

Similarly to the first embodiment, the resist pattern 122 with an opening hole at the position, where the wiring pattern 111 is to be formed, is formed on the copper layer 118 (see FIG. 2D). Then, the wiring pattern 111 is formed on the surface of the copper layer 118 (see FIG. 2E). For example, the wiring pattern 111 is formed through electrolytic copper plating. As this time, as mentioned before, the titanium layer 117 and the copper layer 118 are formed partially on the surface of the tin layer 120. Consequently, as illustrated in FIG. 11D, the wiring pattern 111 is also formed on an exposed surface of the tin layer 120 on which the titanium layer 117 and the copper layer 118 are not formed.

Similarly to the first embodiment, the resist pattern 122 is stripped off. Then, the titanium layer 117 and the copper layer 118 are removed, which exist at the place where the resist pattern 122 has been stripped off (see FIG. 2F). Similarly to the first embodiment, the tin layer 120 is subject to a heat treatment, so that the copper alloy layer 119 is formed between the through electrode 114 and the wiring pattern 111 (see FIG. 2G).

Through the above-described manufacturing process, the wiring pattern 111, the titanium layer 117, the copper layer 118, and the copper alloy layer 119 are formed on a surface of the silicon substrate 110. After the protective layer 121 is stripped off, the wiring pattern 112, the titanium layer, the copper layer, and the copper alloy layer are formed on the other surface of the silicon substrate 110 through the same process. Consequently, the interposer 100 illustrated in FIG. 1 is obtained.

Effects of Second Embodiment

As described above, in the manufacturing method of the interposer 100 according to the second embodiment, the tin layer 120 is formed to have a thickness sufficient to form convex sections and concave sections on the surface thereof. Furthermore, the titanium layer 117 is formed through the sputtering and the material of the titanium layer 117 adheres to the convex sections formed on the surface of the tin layer 120, so that the titanium layer 117 is formed partially on the surface of the tin layer 120. Consequently, according to the second embodiment, similarly to the first embodiment, it is possible to ensure a connection between the through electrode 114 and the wiring pattern 111 while maintaining adhesion property between the oxide layer 115 and the titanium layer 117. Furthermore, since the through electrode 114 and the wiring pattern 111 are stacked without the titanium layer 117 interposed therebetween, no delamination occurs in the interface between the through electrode 114 and the titanium layer 117. Furthermore, according to the second embodiment, since it is not necessary to perform the roughening treatment with respect to the surface of the through electrode 114, it is possible to reduce the number of the manufacturing processes as compared with the manufacturing method described in the first embodiment. Consequently, it is possible to obtain the interposer 100 using a simplified manufacturing method, which can ensure the connection between the through electrode 114 and the wiring pattern 111.

[c] Third Embodiment

In the first and second embodiments, the case where the through electrode is connected to the wiring pattern has been described. However, the technology disclosed herein is not limited thereto. For example, the technology disclosed herein can also be applied in the same manner to the case where an interposer has a multi-layer wiring structure and wiring patterns of respective layers are connected to each other through via-holes. In addition, the via-hole referred to herein is a hole formed in an interlayer dielectric layer in order to electrically connect wirings formed on different layers to each other. Hereinafter, an interposer with a via-hole according to the third embodiment will be described.

FIG. 13 is a sectional view illustrating the structure of an interposer 200 according to the third embodiment. As illustrated in FIG. 13, the interposer 200 according to the third embodiment is formed using a silicon substrate 110 as a base and includes wiring patterns 111 and 211. Furthermore, the interposer 200 includes a through electrode 114 formed in a through hole 113 passing through the silicon substrate 110.

The wiring pattern 111 is stacked on the silicon substrate 110 and the through electrode 114. The wiring pattern 211 is stacked on the wiring pattern 111 via an interlayer dielectric layer 216. For example, the interlayer dielectric layer 216 is made of polyimide, silicon dioxide, epoxy, or the like. The through electrode 114 electrically connects the wiring patterns 111 and 211, which are formed on a surface of the silicon substrate 110, to wiring patterns (not illustrated) formed on the other surface thereof. Furthermore, the wiring pattern 111 is connected to the wiring pattern 211 through a via-hole 213 formed in the interlayer dielectric layer 216.

Then, the oxide layer 115 serving as an insulating layer is formed on the outer surface of the silicon substrate 110 and the inner wall surface of the through hole 113. Furthermore, the titanium layer 117 serving as an adhesive layer is formed between the wiring pattern 111 and the oxide layer 115. In addition, a copper layer 118 serving as an underlayer of the wiring pattern 111 is formed between the wiring pattern 111 and the titanium layer 117.

Here, the wiring pattern 111 is made of copper and the through electrode 114 is also made of copper. Furthermore, the oxide layer 115 is arranged adjacent to the through electrode 114. Furthermore, the wiring pattern 111 is stacked on the oxide layer 115 via the titanium layer 117. Moreover, the wiring pattern 111 is stacked on the through electrode 114 with a copper alloy layer 119 interposed therebetween and formed adjacent to the titanium layer 117. Consequently, according to the third embodiment, it is possible to ensure a connection between the through electrode 114 and the wiring pattern 111 while maintaining adhesion property between the oxide layer 115 and the titanium layer 117. In addition, the wiring pattern 111 described herein, for example, is formed using the manufacturing method described in the first embodiment or the second embodiment.

Moreover, a titanium layer 217 serving as an adhesive layer is formed between the wiring pattern 211 and the interlayer dielectric layer 216. Furthermore, a copper layer 218 serving as an underlayer of the wiring pattern 211 is formed between the wiring pattern 211 and the titanium layer 217. Here, the wiring patterns 111 and 211 are made of copper. Furthermore, the interlayer dielectric layer 216, which is an insulating layer, is arranged adjacent to the wiring pattern 211 in the via-hole 213. The wiring pattern 211 is stacked on the interlayer dielectric layer 216 with the titanium layer 217 interposed therebetween. Furthermore, the wiring pattern 211 is stacked on the wiring pattern 111 with a copper alloy layer 219 interposed therebetween and formed adjacent to the titanium layer 217.

In addition, the layer between the wiring pattern 111 and the wiring pattern 211 described herein, for example, is formed through the manufacturing method using the patterning described in the second embodiment, as will be described below. First, the via-hole 213 is formed in the interlayer dielectric layer 216. For example, the via-hole 213 is formed by processing the interlayer dielectric layer 216 using a laser or the like. Next, a tin layer is formed on the surface of the wiring pattern 111 exposed through the via-hole 213. At this time, the tin layer is formed to have a thickness sufficient to form convex sections and concave sections thereon, so that the convex sections and the concave sections are formed on the surface thereof. Then, the titanium layer 217 and the copper layer 218 are stacked over the whole surface of the interlayer dielectric layer 216 and on the inner wall surface of the via-hole 213. At this time, the titanium layer 217 is formed on the convex section formed on the surface of the tin layer in the bottom of the via-hole 213.

Then, a resist pattern with an opening hole at the position, where the wiring pattern 211 is to be formed, is formed on the copper layer 218. Thereafter, the wiring pattern 211 is formed on the surface of the copper layer 218. At this time, the wiring pattern 211 is also formed on an exposed surface of the tin layer on which the titanium layer 217 and the copper layer 218 are not formed. For example, the wiring pattern 211 is formed through electrolytic copper plating using the titanium layer 217 and the copper layer 218 as a power feeding layer. Thereafter, the resist pattern is stripped off, and the titanium layer 217 and the copper layer 218 are further removed, which exist at the place where the resist pattern has been stripped off. Then, the tin layer is subject to a heat treatment, so that the copper alloy layer 219 is formed between the wiring pattern 211 and the wiring pattern 111.

As described above, in the interposer 200 according to the third embodiment, the wiring pattern 211 and the interlayer dielectric layer 216 are stacked with the titanium layer 217 interposed therebetween. Furthermore, the wiring pattern 211 and the wiring pattern 111 are stacked with the copper alloy layer 219 therebetween in the bottom surface of the via hole 213. Consequently, according to the third embodiment, even when the wiring patterns of respective layers are connected to each other through the via-hole 213, it is possible to ensure a connection between the wiring pattern 211 and the wiring pattern 111 while maintaining adhesion property between the interlayer dielectric layer 216 and the titanium layer 217. Furthermore, since the wiring pattern 211 and the wiring pattern 111 are stacked without the titanium layer 217 interposed therebetween, no delamination occurs in the interface between the wiring pattern 111 and the titanium layer 217.

[d] Fourth Embodiment

In the third embodiment, the case where the wiring patterns of respective layers are connected to each other through the via-hole has been described. However, the technology disclosed herein is not limited thereto. For example, the technology disclosed herein can also be applied in the same manner to the case where a wiring pattern is connected to a bump. In addition, the bump referred to herein is a protrusion electrode formed on the surface of an interposer. The bump connects a wiring included in the interposer to a wiring included in another substrate. Hereinafter, an interposer including the bump according to the fourth embodiment will be described.

Figure 14:
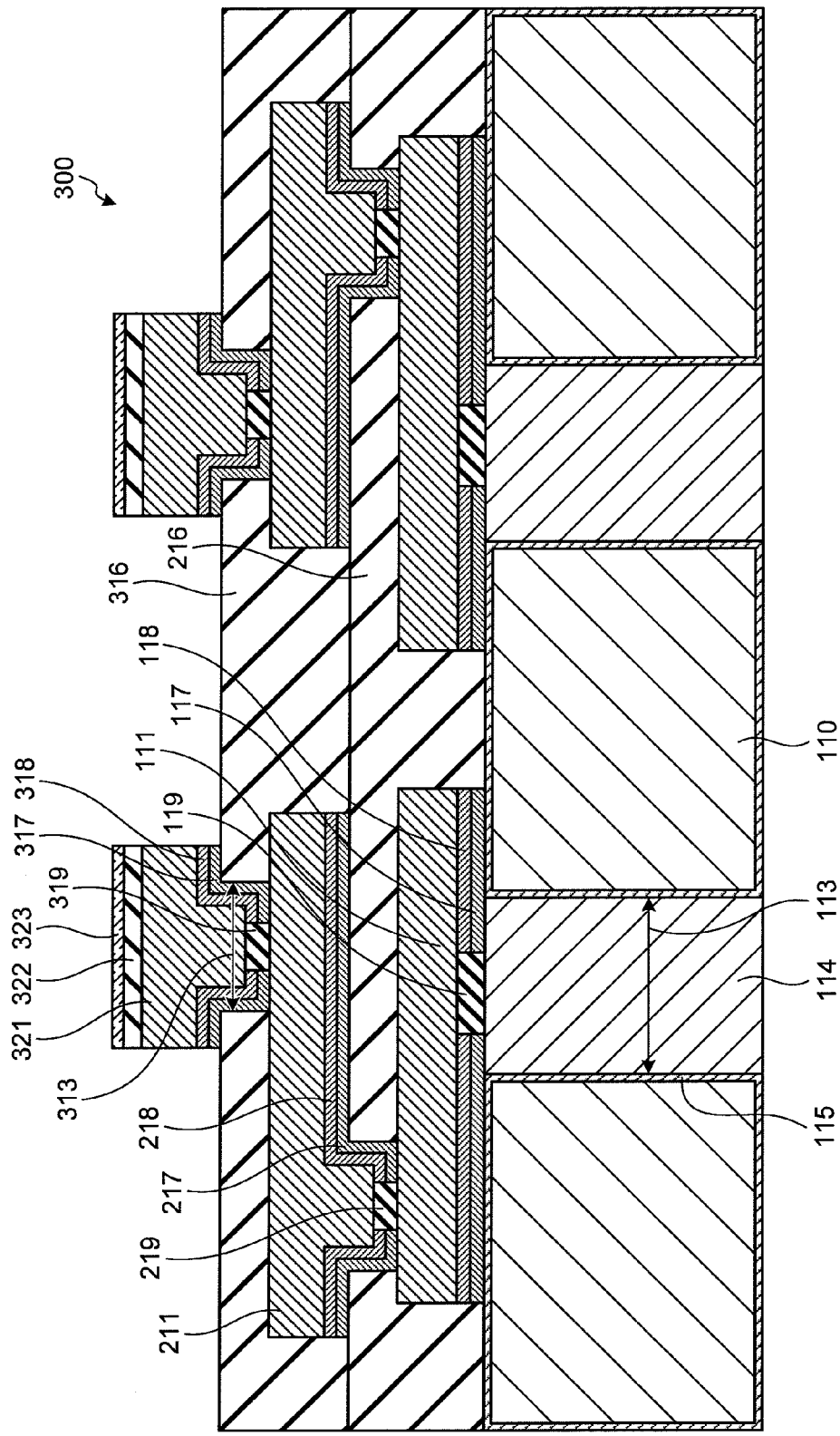
FIG. 14 is a sectional view illustrating the structure of an interposer according to a fourth embodiment.

FIG. 14 is a sectional view illustrating the structure of an interposer 300 according to a fourth embodiment. As illustrated in FIG. 14, the interposer 300 according to the fourth embodiment is formed by additionally mounting an interlayer dielectric layer 316 and a bump 321 on the interposer 200 illustrated in FIG. 13. The interlayer dielectric layer 316 is formed on the surface of the wiring pattern 211 and the surface of the interlayer dielectric layer 216. The interlayer dielectric layer 316, for example, is made of polyimide, silicon dioxide, epoxy, or the like.

A nickel (Ni) layer 322 is formed on the bump 321 to improve the connection reliability between another substrate and electronic parts, and a gold (Au) layer 323 is further formed on the surface of the nickel layer 322. For example, the nickel layer 322 and the gold layer 323 are formed through sputtering. In addition, a solder layer may be formed instead of the gold layer 323. The bump 321 is connected to the wiring pattern 211 through a via-hole 313 formed in the interlayer dielectric layer 316.

Then, a titanium layer 317 serving as an adhesive layer is formed between the bump 321 and the interlayer dielectric layer 316. In addition, a copper layer 318 serving as an underlayer of the bump 321 is formed between the titanium layer 317 and the bump 321. Here, the bump 321 and the wiring pattern 211 are made of copper. Furthermore, the interlayer dielectric layer 316, which is an insulating layer, is arranged adjacent to the bump 321 formed in the via-hole 313. The bump 321 is stacked on the interlayer dielectric layer 316 via the titanium layer 317. Furthermore, the bump 321 is stacked on the wiring pattern 211 with the copper alloy layer 319 interposed therebetween and formed adjacent to the titanium layer 317.

In addition, the layer between the bump 321 and the wiring pattern 211 described herein, for example, is formed through the manufacturing method using the patterning described in the second embodiment, as will be described below. First, the via-hole 313 is formed in the interlayer dielectric layer 316. For example, the via-hole 313 is formed by processing the interlayer dielectric layer 316 using a laser or the like. Then, a tin layer is formed on the surface of the wiring pattern 211 exposed by the via-hole 313. At this time, the tin layer is formed to have a thickness sufficient to form convex sections and concave sections thereon, so that the convex sections and the concave sections are formed on the surface thereof. Then, the titanium layer 317 and the copper layer 318 are stacked over the whole surface of the interlayer dielectric layer 316 and on the inner wall surface of the via hole 313. At this time, the titanium layer 317 is formed on the convex section formed on the surface of the tin layer in the bottom of the via-hole 313.

Then, a resist pattern with an opening hole at the position, where the bump 321 is to be formed, is formed on the copper layer 318. Thereafter, the bump 321 is formed on the surface of the copper layer 318. At this time, the bump 321 is also formed on an exposed surface of the tin layer on which the titanium layer 317 and the copper layer 318 are not formed. For example, the bump 321 is formed through electrolytic copper plating using the titanium layer 317 and the copper layer 318 as a power feeding layer. Thereafter, the nickel layer 322 is formed on the bump 321 through electrolytic plating, and the gold layer 323 is further formed on the surface of the nickel layer 322. Thereafter, the resist pattern is stripped off, and the titanium layer 317 and the copper layer 318 are further removed, which exist at the place where the resist pattern has been stripped off. Then, the tin layer is subject to a heat treatment, so that the copper alloy layer 319 is formed between the bump 321 and the wiring pattern 211.

As described above, in the interposer 300 according to the fourth embodiment, the bump 321 and the interlayer dielectric layer 316 are stacked with the titanium layer 317 interposed therebetween. Furthermore, the bump 321 and the wiring pattern 211 are stacked with copper alloy layer 319 interposed therebetween in the bottom surface of the via-hole 313. Consequently, according to the fourth embodiment, it is possible to ensure a connection between the bump 321 and the wiring pattern 211 while maintaining adhesion property between the interlayer dielectric layer 316 and the titanium layer 317. Furthermore, since the bump 321 and the wiring pattern 211 are stacked without the titanium layer 317 interposed therebetween, no delamination occurs in the interface between the bump 321 and the titanium layer 317.

In addition, in the first embodiment, the example has been described, in which the surface of the tin layer 120 formed on the through electrode 114 is roughened by performing the roughening treatment with respect to the surface of the through electrode 114. On the other hand, in the second embodiment, the example has been described, in which the convex sections and the concave sections are formed on the surface of the tin layer 120 by thickly forming the tin layer 120 without performing the roughening treatment with respect to the surface of the through electrode 114. The first and second embodiments may be combined for embodiment. That is, the roughening treatment is performed with respect to the surface of the through electrode 114 before the tin layer 120 is formed on the through electrode 114, and the tin layer 120 is formed to have a thickness sufficient to form the convex sections and the concave sections on the surface thereof when forming the tin layer 120 on the through electrode 114. In this way, it is possible to coarsely roughen the surface of the tin layer 120 and efficiently form the copper alloy layer 119.

As a method for forming the titanium layer 117 on part of the surface of the tin layer 120, it may be possible to consider a method of processing a formed titanium layer 117 through patterning or the like, besides the methods described in the second and third embodiments. However, in the first and second embodiments, the surface of the tin layer 120 is roughened, so that the titanium layer 117 is formed on part of the surface of the tin layer 120 by just simply performing sputtering with respect to the surface of the tin layer 120 as in the case of forming a titanium layer on a flat surface. Consequently, according to the first and second embodiments, it is possible to ensure a connection between the electrode layer and the copper wiring layer more easily, as compared with the method using the pattering.

Furthermore, in the first to fourth embodiments, the interposer in which only the wiring is arranged on the silicon substrate has been described. However, the technology disclosed herein is not limited thereto. For example, the technology disclosed herein can also be applied in the same manner to the case where various devices such as logic circuits or analog circuits are formed on the silicon substrate 110.

Furthermore, in the first to fourth embodiments, the case has been described, in which the substrate of the interposer is made of the silicon substrate, the insulating layer is made of an oxide layer of silicon dioxide or polyimide, the adhesive layer is made of a titanium layer, and the copper alloy layer is made of an alloy of copper and tin. However, the technology disclosed herein is not limited thereto. For example, the technology disclosed herein can also be applied in the same manner to the case where the substrate of the interposer, the insulating layer, the adhesive layer, and the copper alloy layer are made of other materials. Other materials referred to herein, for example, are an inorganic material such as glass or ceramic in connection with the substrate. Furthermore, in connection with the insulating layer, other materials, for example, are silicon nitride (SiN). Furthermore, in connection with the adhesive layer, other materials, for example, are chrome (Cr). Furthermore, in the case of the copper alloy layer, other materials, for example, are an alloy of tin and silver, indium, an alloy of tin and bismuth or the like. In addition, the copper alloy layer may be made of only tin.

In addition, the first to fourth embodiments are applied to the interposer. However, the technology disclosed herein is not limited thereto. That is, the technology disclosed herein can also be applied in the same manner to other wiring substrates having a multi-layer structure.

Moreover, in the first to fourth embodiments, the case where the wiring pattern or the through electrode is made of copper has been described. However, the technology disclosed herein is not limited thereto. For example, the technology disclosed herein can also be applied in the same manner to the case where the wiring pattern or the through electrode is made of a copper alloy.

According to embodiments of a wiring substrate and a manufacturing method disclosed herein, it is possible to ensure a connection between an electrode layer and a copper wiring layer while maintaining adhesion between an insulating layer and an adhesive layer.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring substrate comprising:
    a wiring layer made of copper;
    a through electrode made of copper and passing through a substrate;
    an insulating layer made of silicon dioxide and arranged adjacent to the through electrode,
    wherein the wiring layer is stacked on the through electrode and the insulating layer,
    the insulating layer and the wiring layer are stacked with an adhesive layer made of titanium interposed between the insulating layer and the wiring layer, and
    the through electrode and the wiring layer are stacked with a copper alloy layer made of an alloy of copper and tin, formed adjacent to the adhesive layer and interposed between the through electrode and the wiring layer, wherein the adhesive layer is further formed on part of the copper alloy layer.

2. A manufacturing method of a wiring substrate, the method comprising:
    forming a substrate in which a through hole is formed and whose surface is covered by an insulating layer made of silicon dioxide;
    forming a through electrode by filling the through hole with copper;

forming a tin layer on one side of the through electrode;

forming a titanium adhesive layer over one surface of the insulating layer and part of a surface of the tin layer;

forming a wiring layer using copper on a surface of the titanium adhesive layer and an exposed surface of the tin layer; and forming a copper alloy layer which is an alloy of copper and tin by performing a heat treatment with respect to the tin layer, wherein the adhesive layer is further formed on part of the copper alloy layer, wherein the copper alloy layer is formed adjacent to the adhesive layer and interposed between the through electrode and the wiring layer.

3. The method according to claim 2, further comprising:

forming a convex section and a concave section on the surface of the through electrode through a roughening treatment before the forming of the tin layer, wherein, in the forming of the tin layer, a convex section and a concave section are formed on the surface of the tin layer to follow a shape of the surface of the through electrode, and wherein, in the forming of the titanium adhesive layer, a titanium layer to serve as the titanium adhesive layer is formed through sputtering and a material of the titanium layer adheres to the convex section formed on the tin layer, so that the titanium adhesive layer is formed on part of the surface of the tin layer.

4. The method according to claim 2, wherein, in the forming of the tin layer, the tin layer is formed to have a thickness sufficient to form a convex section and a concave section on the surface of the tin layer, and wherein, in the forming of the titanium adhesive layer, a titanium layer to serve as the titanium adhesive layer is formed through sputtering and a material of the titanium layer adheres to the convex section formed on the tin layer, so that the titanium adhesive layer is formed on part of the surface of the tin layer.

* * * * *